United States Patent [19]

Mochizuki

[11] Patent Number: 4,533,935

[45] Date of Patent: Aug. 6, 1985

[54] SEMICONDUCTOR DEVICE AND A METHOD FOR MANUFACTURING THE SAME

[75] Inventor: Toru Mochizuki, Yokohama, Japan

[73] Assignee: Tokyo Shibaura Denki Kabushiki Kaisha, Japan

[21] Appl. No.: 289,995

[22] Filed: Aug. 4, 1981

[30] Foreign Application Priority Data

Sep. 4, 1980 [JP] Japan ................................ 55-122651

[51] Int. Cl.$^3$ ..................... H01L 27/02; H01L 29/34; H01L 23/48
[52] U.S. Cl. ....................................... 357/51; 357/54; 357/59; 357/67; 357/71
[58] Field of Search ................... 357/51, 54, 59, 67 S, 357/71

[56] References Cited

U.S. PATENT DOCUMENTS

| 4,146,902 | 3/1979 | Tanimoto et al. | 357/59 |
| 4,246,593 | 1/1981 | Bartlett | 357/51 |
| 4,282,647 | 8/1981 | Richman | 357/54 |
| 4,392,150 | 7/1983 | Courreges | 357/67 S |

OTHER PUBLICATIONS

T. Ohzone et al., "A 2K×8-Bit Static Ram," IEDM Digest of Technical Papers, 1978, pp. 360-363.

T. Mochizuki et al., "Film Properties of MoSi$_2$ and Their Application to Self-Aligned MoSi$_2$ Gate MOSFET," IEEE Transactions on Electron Devices, vol. ED-27, No. 8, Aug. 1980.

*Primary Examiner*—Gene M. Munson
*Attorney, Agent, or Firm*—Finnegan, Henderson, Farabow, Garrett & Dunner

[57] ABSTRACT

A semiconductor device provided with a circuit resistor. The device comprises a first conductive layer overlying a semiconductor substrate, an insulation layer deposited on the first conductive layer, a second conductive layer formed on the insulation layer, and a resistor for connecting together the first and second conductive layers. The portion of the resistor which exerts resistance is provided in an opening selectively drilled in the insulation layer with a sufficient depth to contact the first conductive layer.

2 Claims, 31 Drawing Figures

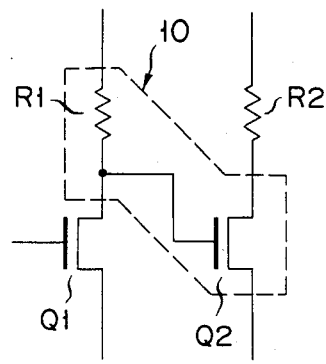
F I G. 1
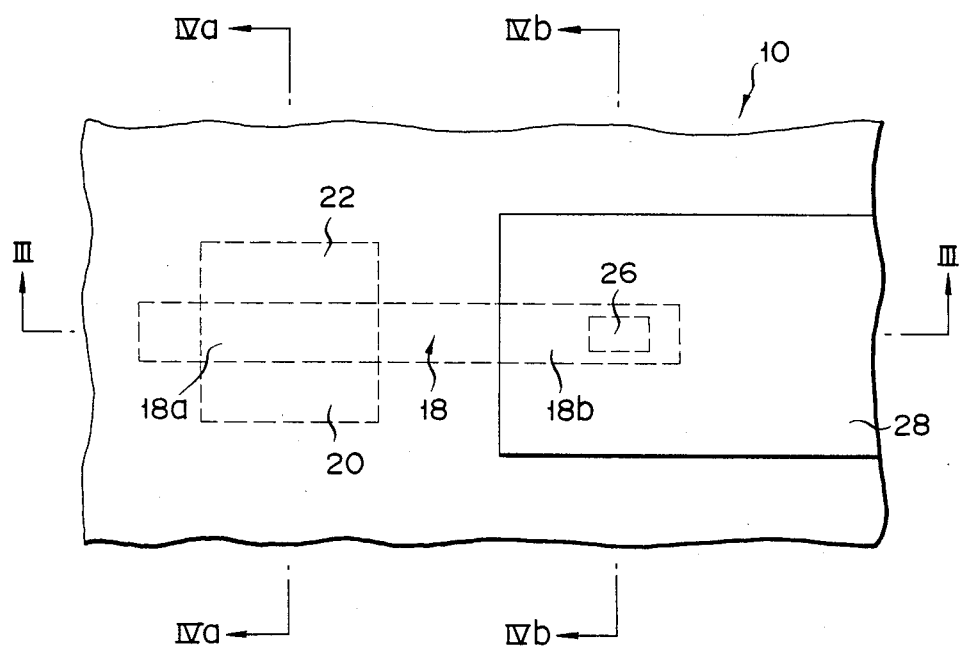
F I G. 2

SEMICONDUCTOR DEVICE AND A METHOD FOR MANUFACTURING THE SAME

BACKGROUND OF THE INVENTION

This invention relates to a semiconductor device provided with a circuit resistor and a method for manufacturing the same.

A resistor of a bipolar semiconductor integrated circuit has hitherto been formed of a diffusion resistor. With a MOS integrated circuit, a MOS FET unit is generally applied as a resistor. Both types of resistors occupy a considerable space in an integrated circuit, presenting great difficulties in providing a highly integrated circuit. With a MOS integrated circuit, therefore, a polycrystalline silicon layer used as a resistor is laminated with a gate electrode of a MOS FET unit in integration. ("A 2K×8-BIT STATIC RAM" by T. Ohzone, IEDM, Dig. of Tech. Paper, 1978, pp. 360 to 363). However, the application of this proposed process is limited to a semiconductor device such as a MOS FET unit in which a gate electrode and resistor can be laminated with each other with an insulation layer interposed therebetween.

SUMMARY OF THE INVENTION

It is accordingly an object of this invention to provide a semiconductor device which can be integrated with greater density by reducing the size of a resistor.

Another object of the invention is to provide a method of manufacturing a semiconductor device allowing for higher integration by miniaturizing a resistor.

To attain the above-mentioned object, this invention provides a semiconductor device which comprises:

a first conductive layer formed at refractory metal silicide overlying a semiconductor substrate;

an insulation layer formed on the first conductive layer;

a second conductive layer formed on the insulation layer; and a resistor, formed of an oxide or nitride of the refractory metal silicide, which is connected between the first and second conductive layers, that portion of the resistor which exerts resistance being formed in an opening selectively formed in the insulation layer.

Where the first conductive layer is formed of a refractory metal silicide layer and, after forming an opening in the insulation layer, the refractory metal silicide layer is oxidized or nitrogenized, then it is possible to form a resistor having a small cross-sectional area in the opening, thereby increasing the resistance of the resistor. Since it is possible to form a resistor having a small cross-sectional area as viewed in the direction of the thickness of a chip, the resultant semiconductor device can be integrated with higher density. Where a polycrystalline silicon layer is contacted by a refractory metal silicide layer in the aforementioned opening, and the whole mass is subjected to high temperature treatment, then it is possible to provide another type of resistor allowing for the high integration of a semiconductor device. Further, where the polycrystalline silicon layer contacted by the refractory metal silicide layer is heat treated at high temperature in an inert atmosphere, then it is possible to assure high contact resistance.

BRIEF DESCRIPTION OF THE DRAWINGS

Other objects and advantages of the invention will become apparent from the following detailed description when taken in conjunction with the accompanying drawings, in which:

FIG. 1 is a circuit diagram showing the elements of a MOS integrated circuit by way of illustrating the arrangement of a semiconductor device according to the following embodiments of this invention;

FIG. 2 is a fractional plan view of a semiconductor device according to a first embodiment of the invention;

DETAILED DESCRIPTION OF THE PREFERRED EMBODIMENTS

Throughout the discussion of the embodiments of this invention, an MOS integrated circuit comprises MOS FETs Q1, Q2 and load resistors R1, R2 as shown in FIG. 1. Description is now given of the broken line section 10 of the MOS integrated circuit which includes a load resistor R1 and MOS FET Q2. It will be noted that this invention is not limited to the illustrative embodiments discussed.

Figure 3:
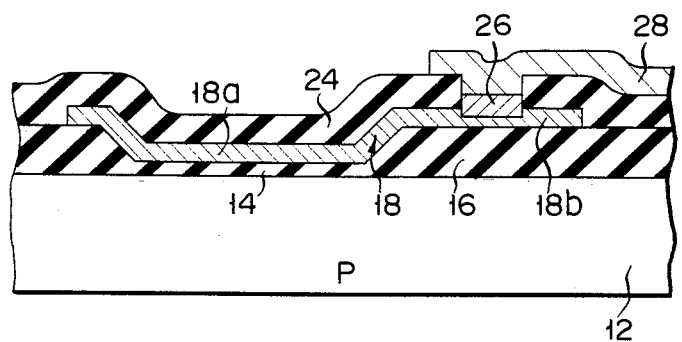
FIG. 3 is a sectional view on line III—III of the semiconductor device of FIG. 2.
Figure 4A:
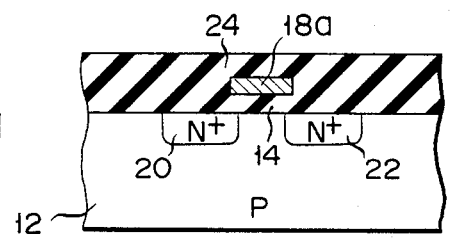
FIG. 4a is a sectional view on line IVa—IVa of the semiconductor device of FIG. 2.
Figure 4B:
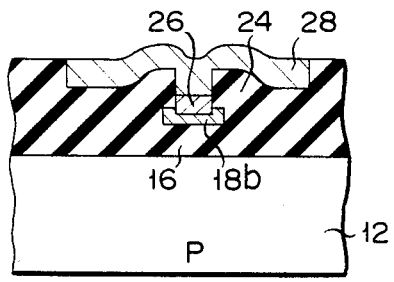
FIG. 4b is a sectional view on line IVb—IVb of the semiconductor device of FIG. 2.

FIG. 2 is a plan view of the aforementioned section 10 of a semiconductor device according to a first embodiment of this invention. FIG. 3 is a sectional view on line III—III of the semiconductor device of FIG. 2. FIG. 4a is a sectional view on line IVa—IVa of the semiconductor device. FIG. 4b is a sectional view on line IVb—IVb of the semiconductor device. Referring to FIG. 3, a first conductive layer 18 is mounted on a P-type silicon substrate 12 with a gate oxide layer (for example, $SiO_2$) 14 and a field oxide layer (for example, $SiO_2$) 16 interposed between the first conductive layer 18 and P-type silicon substrate 12. An $N^+$-type source region 20 and drain region 22 of a transistor Q2 are formed in the semiconductor substrate 12. The first conductive layer 18 acts as a gate electrode 18a and electrode wiring 18b of the transistor Q2. An oxide layer 24 is deposited on the first conductive layer 18 by the chemical vapor deposition (CVD) process with a thickness of 5,000 Å.

A resistor 26 formed of $TiO_2$-$SiO_2$ is deposited in an opening selectively formed in the CVD oxide layer 24 in contact with the first conductive layer 18. A second conductive layer 28 of aluminum is provided in contact with the opposite side of the resistor 26. The resistor 26 functions as the resistor R1 of FIG. 1.

The photoengraving process (PEP) enables an opening to be formed in the CVD oxide layer 24 with an extremely small diameter in the form extending in the direction of the thickness of the semiconductor substrate 12. Therefore, the resistor 26 can be formed in the opening with an extremely small area and high resistance, thereby assuring the high integration of a semiconductor device.

Figure 5A:
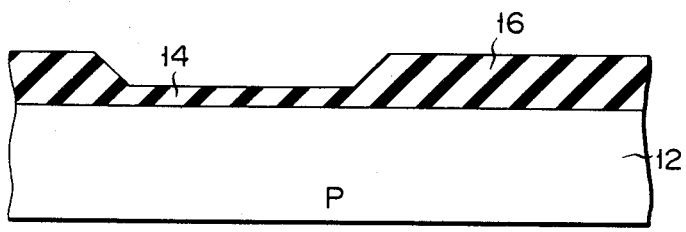
FIGS. 5a to 5e are fractional sectional views of the semiconductor device of FIG. 2 illustrating the sequential steps of manufacturing the same.

Description is now given with reference to FIGS. 5a to 5e of a method of manufacturing a semiconductor device according to a first embodiment of this invention. In the step of FIG. 5a, the silicon substrate 12 is thermally oxidized to form a gate oxide layer 14 of $SiO_2$. Further, the field oxide layer 16 is selectively deposited on the silicon substrate 12 by the CVD process.

Figure 5B:
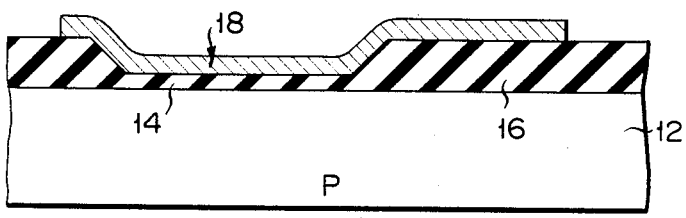

In the step of FIG. 5b, a layer of titanium (Ti) and a layer of silicon (Si) are deposited on the semiconductor substrate 12 at the same time to provide a titanium silicide layer with a thickness of 3,000 Å. The titanium silicide layer is selectively etched, for example, in a gas plasma to form the first conductive layer 18 constituting the gate electrode 18a and electrode wiring 18b of the MOS FET Q2. Thereafter, as shown in FIG. 4, an N-type impurity is selectively injected into the semiconductor substrate 12 by ion implantation to form the source and drain regions (not shown) of the MOS FET Q2.

Figure 5C:
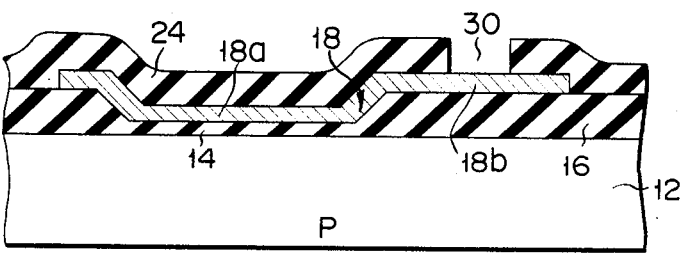

In FIG. 5c, a silicon oxide ($SiO_2$) layer 24 is deposited all over the laminated mass by the CVD process with a thickness of about 5,000 Å. An opening 30 is formed in the $SiO_2$ layer 24 with a sufficient depth to contact the electrode wiring 18b of the first conductive layer 18.

Figure 5D:
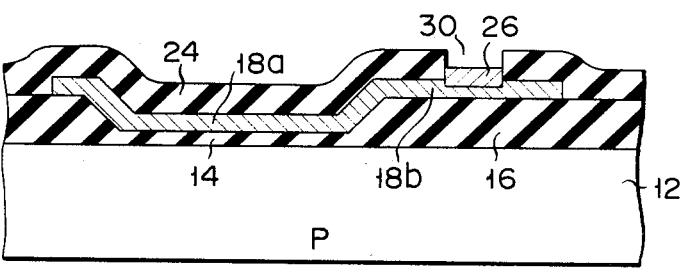
Figure 5E:
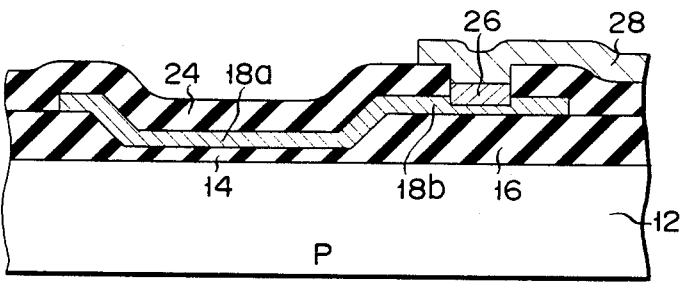

In FIG. 5d, the semiconductor substrate 12 is thermally treated in an atmosphere of dry oxygen at 1,000° C. to oxidize the first conductive layer 18 of titanium silicide formed in the opening 30, thereby forming the resistor 26 of $TiO_2$-$SiO_2$. In FIG. 5e, a second conductive layer of aluminum is deposited in contact with the resistor 26.

As described above, the resistor 26 of $TiO_2$-$SiO_2$ is formed in a state almost vertically extending from the first conductive layer 18 of titanium silicide deposited in the opening 30 drilled in the CVD oxide layer 24 toward the surface of the semiconductor substrate 12. Now let it be assumed that the molar ratio of titanium and silicon constituting the titanium silicide layer is 1:2, that the opening 30 has a size of $2 \times 2$ $\mu m^2$, and that the surface of the titanium silicide layer is oxidized to a thickness of about 1,000 Å. Then the resistor 26 is formed with a resistance of about 6 MΩ. The resistance of the resistor 26 can of course vary with, for example, the composition of the titanium silicide layer, the size of the opening 30 and the condition in which the titanium silicide layer is oxidized. The above-mentioned first embodiment in which a resistor is formed in an extremely small space enables an element of high resistivity to be produced from a material having a prescribed resistivity. The formation of a high resistivity element in a very small space assures the high integration of a semiconductor device.

The first conductive layer 18 of titanium silicide formed inside of the opening can obviously be oxidized throughout the thickness.

Titanium may be replaced by any other refractory metal such as platinum (Pt), tungsten (W), molybdenum (Mo), tantalum (Ta), palladium (Pd), hafnium (Hf), or zirconium (Zr).

Figure 6A:
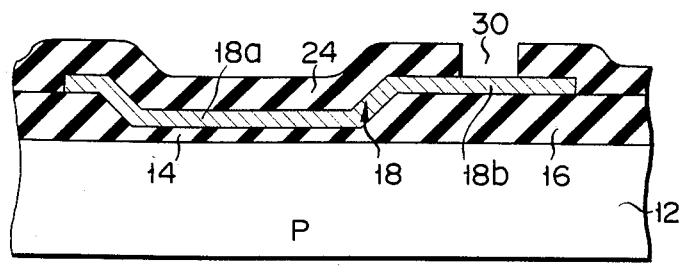
FIGS. 6a to 6e are fractional sectional views of a semiconductor device according to a second embodiment of the invention, illustrating the sequential steps of manufacturing the same.

Description is now given with reference to FIGS. 6a to 6e of a semiconductor device according to a second embodiment of this invention. In FIG. 6a, a P-type semiconductor substrate 12 is thermally oxidized to form a gate oxide layer 14. Then a field oxide layer 16 is formed in a selected place by the CVD process. A polycrystalline silicon layer containing a prescribed impurity is deposited on the gate oxide layer 14 and the field oxide layer 16 to provide a first conductive layer 18, which comprises a gate electrode 18a and electrode wiring 18b, by patterning. An oxide layer 24 is laid on the first conductive layer 18 by the CVD process.

An opening 30 is formed in a selected place in the oxide layer 24 with a sufficient depth to cut into the electrode wiring 18b. The first conductive layer 18 is doped with a prescribed impurity to have a low specific resistance. Though not shown, source and drain regions are formed in the semiconductor substrate 12 by diffusing an impurity therein with the first conductive layer 18 used as a mask.

Figure 6B:
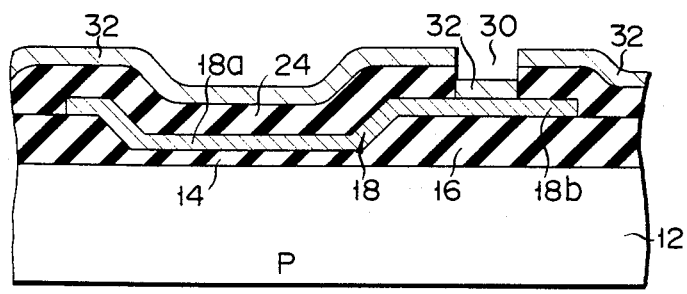
Figure 6C:
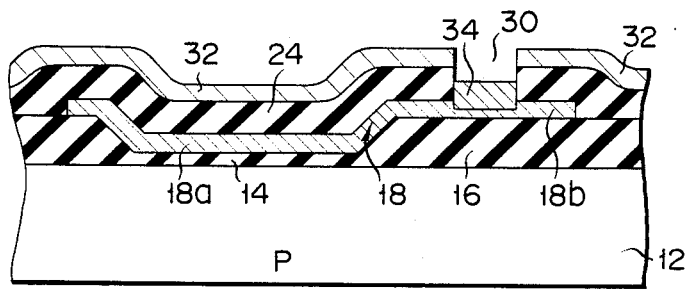
Figure 6D:
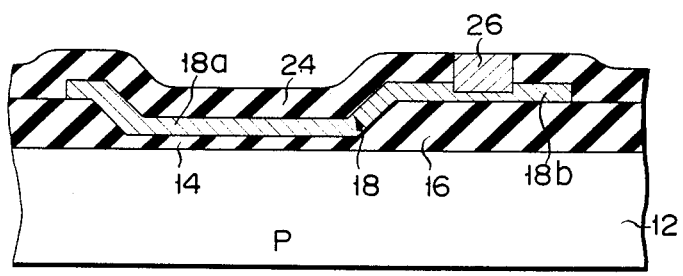
Figure 6E:
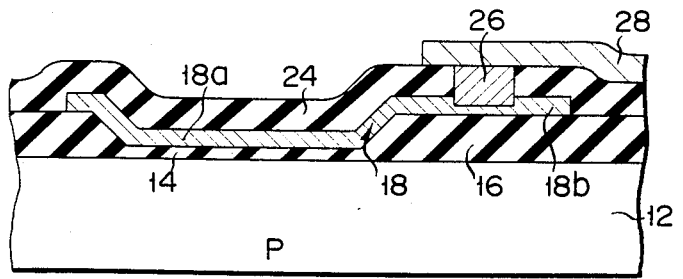

In FIG. 6b, a platinum layer 32 is deposited all over the oxide layer 24 with a thickness of about 1,000 Å. In FIG. 6c, heat treatment is applied at almost 500° C. for about 30 minutes to form a platinum silicide layer 34 in the opening 30. The platinum layer 32 formed on the CVD oxide layer 24 is not affected by the heat treatment, but remains intact. The platinum layer 32 is selectively removed by boiling aqua regia. Later, oxidation is carried out for about 30 minutes in an atmosphere of dry oxygen $O_2$ at about 1,000° C. In FIG. 6d, a resistor 26 of Pt-$SiO_2$ is formed in the opening 30. In FIG. 6e, a second conductive layer 28 of aluminum is formed in contact with the resistor 26.

In the second embodiment, a high resistivity element can be formed in an extremely small space as in the first embodiment.

In the foregoing two embodiments, an oxidized refractory metal silicide was used as a resistor. However, another resistor can be produced in as small a space and with as high a resistivity as in the two embodiments from refractory metal silicide thermally nitrogenized in, for example, an atmosphere of ammonia ($NH_3$).

Figure 7A:
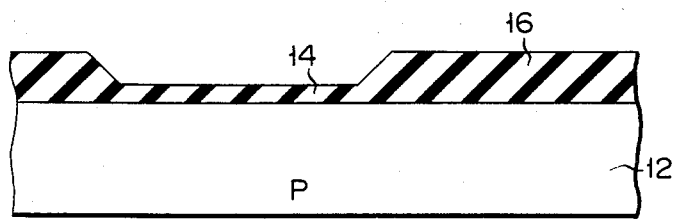
FIGS. 7a to 7e are fractional sectional views of a semiconductor device according to a third embodiment of the invention, illustrating the sequential steps of manufacturing the same.
Figure 7B:
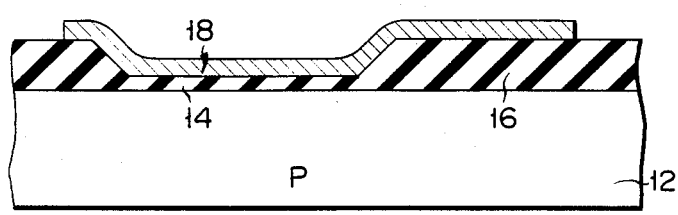

Description is now given with reference to FIGS. 7a to 7e for a semiconductor device according to a third embodiment of this invention. In FIG. 7a, a gate oxide layer 14 and field oxide layer 16 both formed of $SiO_2$ are deposited on a P-type silicon substrate 12. In FIG. 7b, a molybdenum silicide layer is formed on the gate oxide layer 14 and the field oxide layer 16. The molybdenum silicide layer is selectively etched by a gas plasma of $CF_4/O_2$ to provide a first conductive layer 18 which comprises a gate electrode 18a and gate wiring 18b. The molybdenum silicide layer 18 can be deposited by the sputtering or CVD process, or by simultaneous deposition of molybdenum and silicon.

Figure 7C:
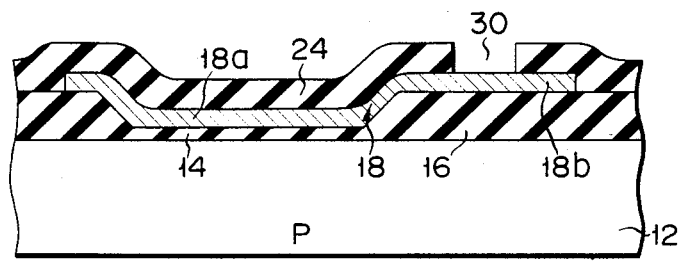
Figure 7D:
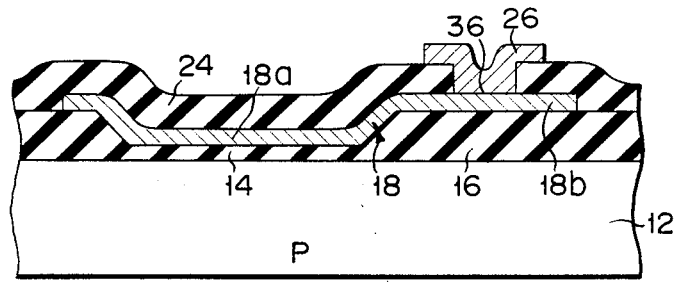

In FIG. 7c, an oxide layer 24 is deposited all over the laminated mass by the CVD process with a thickness of about 5,000 Å. An opening 30 is formed in the oxide layer 24 by the PEP. In FIG. 7d, a polycrystalline silicon is formed by the CVD process, and selectively etched in a gas plasma of $CF_4/O_2$ to provide a resistor 26. Thereafter, heat treatment is applied at about 1,000° C. for about 30 minutes in an atmosphere of $N_2$ to produce contact resistance of about $10^{-3}$ $\Omega cm^2$ in an interface 36 defined between the polycrystalline silicon layer and molybdenum silicide layer. Where the opening 30 has a size of, for example, $1 \times 1$ $\mu m^2$, then the contact resistance indicates about $10^5$ $\Omega$. Where the opening 30 has a size of, for example $0.5 \times 0.5$ $\mu m^2$, then the contact resistance shows about $4 \times 10^5$ $\Omega$. In either case, the contact resistance sufficiently serves the practical purpose.

Figure 7E:
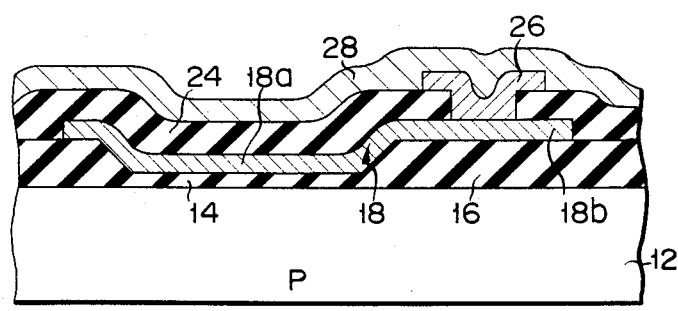

In FIG. 7e, a second conductive layer 28 of Al-Si containing about 1% of silicon is deposited by sputtering. In the third embodiment, a resistor can be formed in part of the first conductive layer 18 is as small a space and with as high resistance as in the preceding two embodiments.

Figure 8:
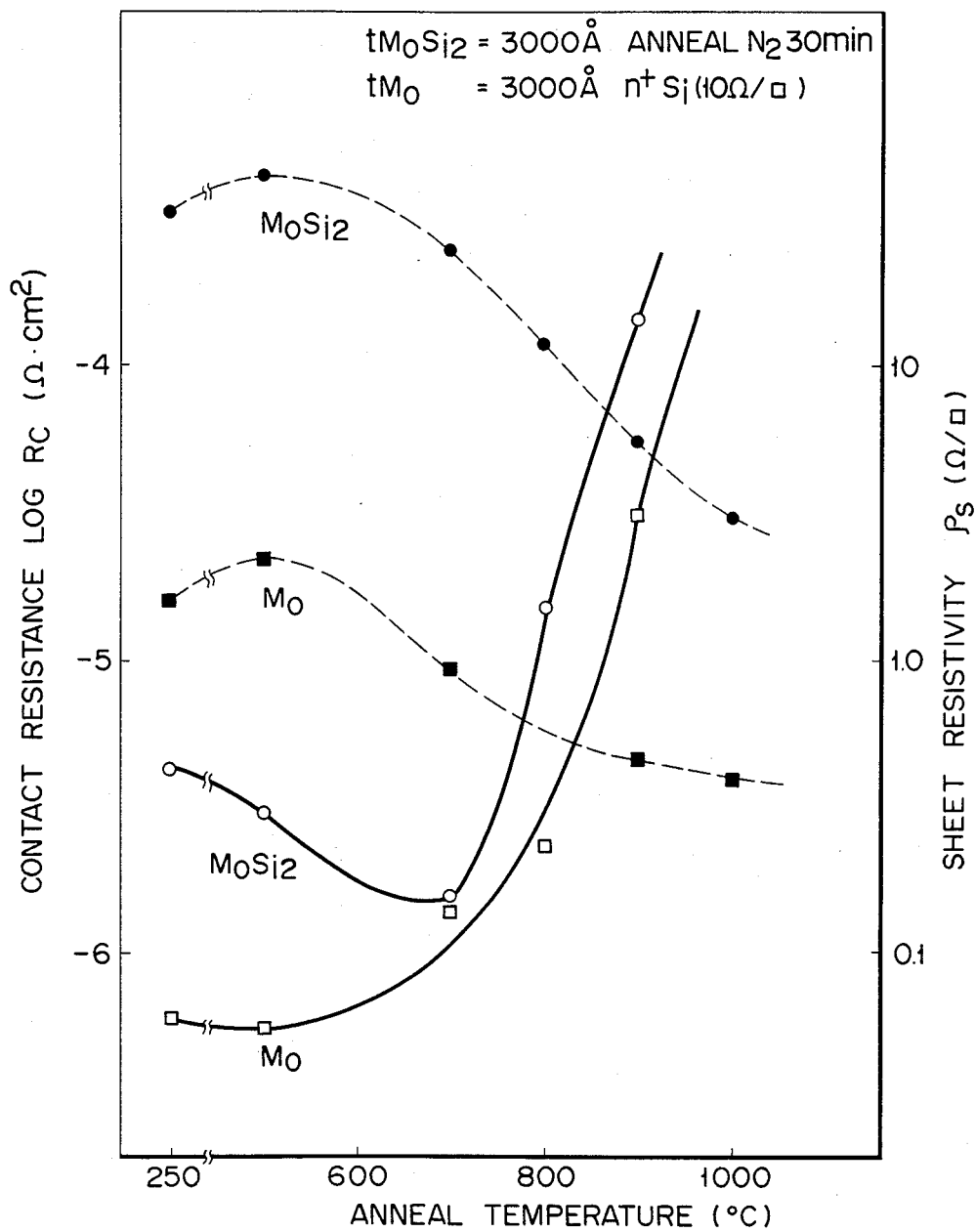
FIG. 8 graphically indicates contact resistance between a single crystal silicon layer and a molybdenum silicide layer or molybdenum layer, and sheet resistivity therebetween.

Further, the replacement of the molybdenum silicide layer by a molybdenum layer attains the same effect. The present inventors have experimentally proved that high-temperature heat-treatment increases contact resistance between a single crystal silicon layer and a molybdenum silicide layer or molybdenum layer ("Film Properties of MoSi2 and Their Application to Self-Aligned MoSi2 Gate MOS FET" by T. Mochizuki et al., IEEE Transaction on Electron Devices, Vol. ED-27, No. 8, August, 1980). Data obtained in the above-mentioned experiments are given in FIG. 8. The solid lines denote contact resistance $R_c$, and the broken lines indicate sheet resistance $\rho_s$. In the paper, single crystal silicon was used. However, replacement of the single crystal silicon by polycrystalline silicon gives the same effect.

Figure 9A:
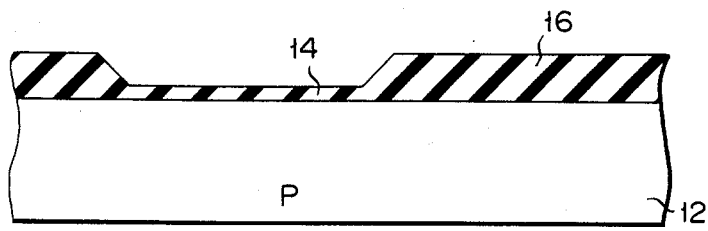
FIGS. 9a to 9e are fractional sectional views of a semiconductor device according to a fourth embodiment of the invention, illustrating the sequential steps of manufacturing the same.
Figure 9B:
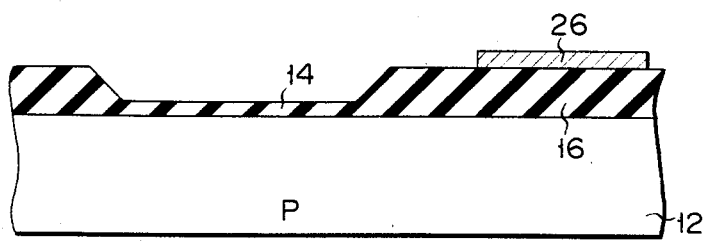
Figure 9C:
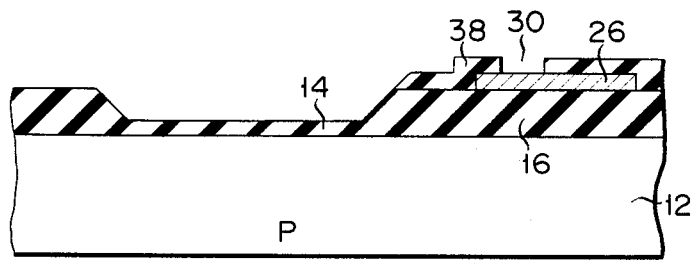

Description is now given with reference to FIGS. 9a to 9e of a semiconductor device according to a fourth embodiment of this invention. In FIG. 9a, a gate oxide layer 14 and field oxide layer 16 both made of $SiO_2$ are deposited on a P-type silicon substrate 12. In FIG. 9b, a resistor 26 of molybdenum silicide is selectively formed on the field oxide layer 16. In FIG. 9c, an oxide layer 38 of $SiO_2$ is deposited around the resistor 26. An opening 30 is formed on the resistor 26 by the PEP.

Figure 9D:
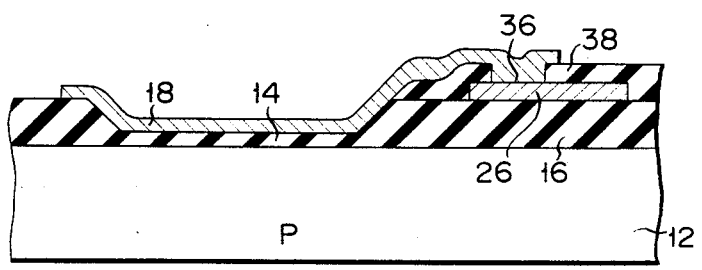

In FIG. 9d, a polycrystalline layer is deposited on the semiconductor substrate 12 and selectively etched to provide a first conductive layer 18. At this time, the resistor 26 and first conductive layer 18 are connected together through the opening 30. Thereafter heat treatment is carried out in an atmosphere of $N_2$ at almost 1,000° C. for about 30 minutes, thereby producing contact resistance of about $10^{-3}$ $\Omega cm^2$ in an interface 36 defined between the polycrystalline layer and molybdenum silicide layer.

Figure 9E:
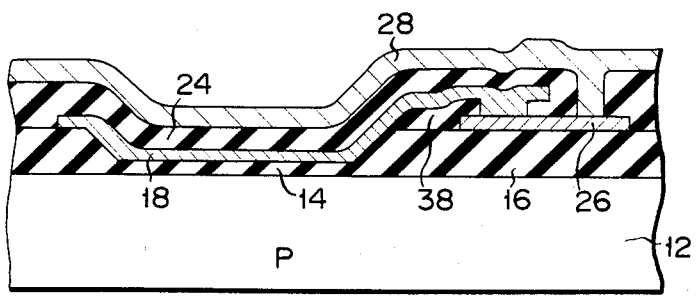

In FIG. 9e, an oxide layer 24 is deposited by the CVD process all over the laminated mass. A different opening from the aforementioned opening 30 is drilled by the PEP with a sufficient depth to contact the resistor 26. Last, a second conductive layer 28 of Al-Si containing about 1% of silicon is formed by sputtering. In the fourth embodiment, a resistor can be formed in as small a space and with as high resistance as in the foregoing three embodiments.

Figure 10A:
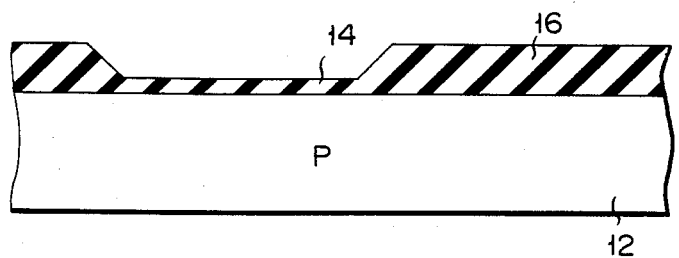
FIGS. 10a to 10e are fractional sectional views of a semiconductor device according to a fifth embodiment of the invention, illustrating the sequential steps of manufacturing the same.
Figure 10B:
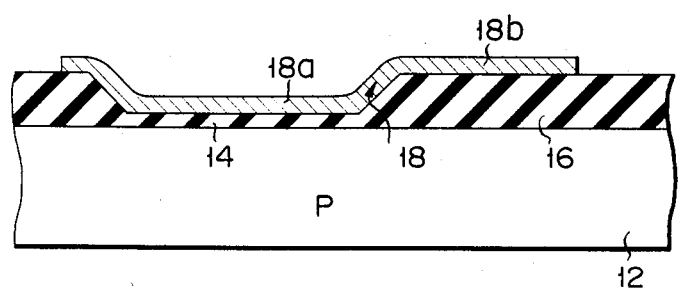

Description is now given with reference to FIGS. 10a to 10e of a semiconductor device according to a fifth embodiment of this invention. In FIG. 10a, a gate oxide layer 14 and field oxide layer 16 both made of $SiO_2$ are formed on a P-type silicon substrate 12. In FIG. 10b, a polycrystalline silicon layer is deposited on the gate oxide layer 14 and field oxide layer 16, and selectively etched to produce a first conductive layer 18 which comprises a gate electrode 18a and electrode wiring 18b.

Figure 10C:
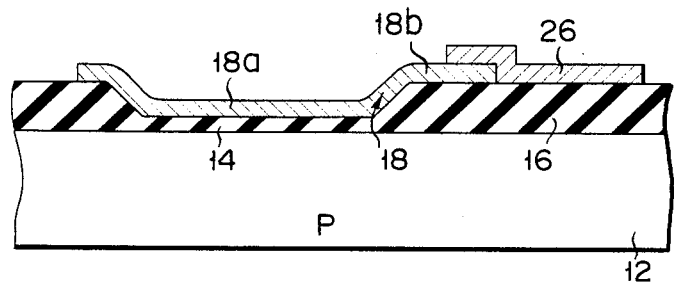

In FIG. 10c, a resistor 26 of molybdenum silicide is formed in contact with the end portion of the electrode wiring 18b. Thereafter heat treatment is carried out at almost 1,000° C. for about 30 minutes in an atmosphere of $N_2$, thereby producing contact resistance of about $10^{-3}$ $\Omega cm^2$ in an interface defined between the polycrystalline layer and molybdenum silicide layer.

Figure 10D:
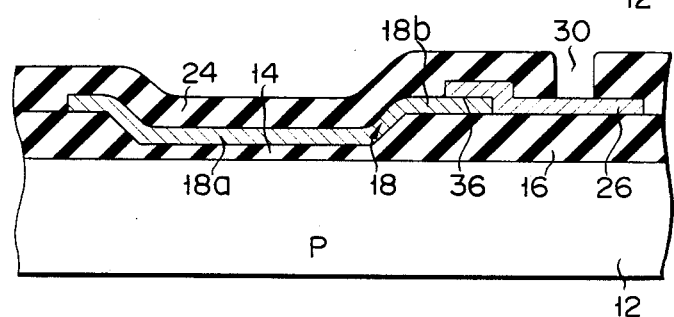
Figure 10E:
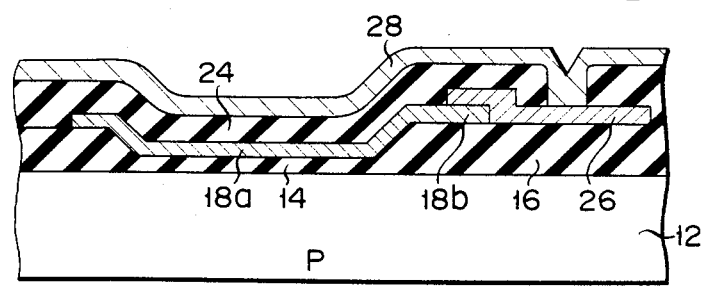

In FIG. 10d, an oxide layer 24 of $SiO_2$ is deposited by the CVD process all over the laminated mass. An opening 30 is drilled by the PEP with such a depth as contacts that portion of the resistor 26 which lies a little apart from a junction between the resistor 26 and electrode wiring 18b. Last, in FIG. 10e, a second conductive layer 28 of Al-Si containing about 1% of silicon is deposited by sputtering.

In the fifth embodiment, as high a resistance as in the foregoing four embodiments can be produced in an extremely small contact area between the first conductive layer 18 and resistor 26.

What is claimed is:

1. A semiconductor device which comprises:
   a first conductive layer formed of refractory metal silicide overlying a semiconductor substrate;
   an insulation layer formed on the first conductive layer;
   a second conductive layer formed on the insulation layer; and
   a resistor formed of an oxide or nitride of the refractory metal silicide which connects together the first and second conductive layers, that portion of said resistor which exerts resistance being formed in an opening selectively formed in the insulation layer.

2. The semiconductor device according to claim 1, wherein said refractory metal silicide is formed with at least one refractory metal selected from the group consisting of titanium (Ti), platinum (Pt), tungsten (W), molybdenum (Mo), tantalum (Ta), palladium (Pd), hafnium (Hf), and zirconium (Zr).

* * * * *